(12) United States Patent
Mullen et al.

(10) Patent No.: US 10,345,383 B2
(45) Date of Patent: Jul. 9, 2019

(54) USEFUL BATTERY CAPACITY / STATE OF HEALTH GAUGE

(71) Applicant: Hand Held Products, Inc., Fort Mill, SC (US)

(72) Inventors: Jeffrey Wayne Mullen, Marion, IA (US); Mark Alan Howe, Central City, IA (US); Ramon Redondo, Marion, IA (US)

(73) Assignee: Hand Held Products, Inc., Fort Mill, SC (US)

( * ) Notice: Subject to any disclaimer, the term of this patent is extended or adjusted under 35 U.S.C. 154(b) by 369 days.

(21) Appl. No.: 14/792,703

(22) Filed: Jul. 7, 2015

(65) Prior Publication Data
US 2017/0010328 A1    Jan. 12, 2017

(51) Int. Cl.
G01R 31/36    (2019.01)
G01R 31/382    (2019.01)
G01R 31/3828    (2019.01)
G01R 31/392    (2019.01)

(52) U.S. Cl.
CPC ....... *G01R 31/3648* (2013.01); *G01R 31/382* (2019.01); *G01R 31/3828* (2019.01); *G01R 31/392* (2019.01)

(58) Field of Classification Search
CPC .................. G01R 31/3648; G01R 31/3606
See application file for complete search history.

(56) References Cited

U.S. PATENT DOCUMENTS

| | | | |
|---|---|---|---|
| 6,832,725 B2 | 12/2004 | Gardiner et al. |
| 7,128,266 B2 | 10/2006 | Marlton et al. |
| 7,159,783 B2 | 1/2007 | Walczyk et al. |
| 7,413,127 B2 | 8/2008 | Ehrhart et al. |
| 7,726,575 B2 | 6/2010 | Wang et al. |
| 8,294,969 B2 | 10/2012 | Plesko |
| 8,317,105 B2 | 11/2012 | Kotlarsky et al. |
| 8,322,622 B2 | 12/2012 | Suzhou et al. |

(Continued)

FOREIGN PATENT DOCUMENTS

| | | |
|---|---|---|
| WO | 2013163789 A1 | 11/2013 |
| WO | 2013173985 A1 | 11/2013 |

(Continued)

OTHER PUBLICATIONS

U.S. Appl. No. 14/519,179 for Dimensioning System With Multipath Interference Mitigation filed Oct. 21, 2014 (Thuries et al.); 30 pages.

(Continued)

*Primary Examiner* — Tri M Hoang
(74) *Attorney, Agent, or Firm* — Additon, Higgins & Pendleton, P.A.

(57) ABSTRACT

A device is disclosed that determines the actual capacity of a battery. The device determines the charge state of the battery and monitors discharge events. Before additional charge is applied, a minimum useful capacity is recorded based on passed charge values recorded by a battery gas gauge during discharge. Before a low voltage shut down, a full capacity is recorded based on passed charge values. The battery capacity information can be used to provide insights on the timing for battery replacement and for improvement in workflows involving the device.

18 Claims, 4 Drawing Sheets

(56) References Cited

U.S. PATENT DOCUMENTS

| | | | |
|---|---|---|---|
| 8,366,005 B2 | 2/2013 | Kotlarsky et al. | |
| 8,371,507 B2 | 2/2013 | Haggerty et al. | |
| 8,376,233 B2 | 2/2013 | Van Horn et al. | |
| 8,381,979 B2 | 2/2013 | Franz | |
| 8,384,390 B2 * | 2/2013 | Zhang | G01R 31/3658 320/118 |
| 8,390,909 B2 | 3/2013 | Plesko | |
| 8,408,464 B2 | 4/2013 | Zhu et al. | |
| 8,408,468 B2 | 4/2013 | Horn et al. | |
| 8,408,469 B2 | 4/2013 | Good | |
| 8,424,768 B2 | 4/2013 | Rueblinger et al. | |
| 8,448,863 B2 | 5/2013 | Xian et al. | |
| 8,457,013 B2 | 6/2013 | Essinger et al. | |
| 8,459,557 B2 | 6/2013 | Havens et al. | |
| 8,469,272 B2 | 6/2013 | Kearney | |
| 8,474,712 B2 | 7/2013 | Kearney et al. | |
| 8,479,992 B2 | 7/2013 | Kotlarsky et al. | |
| 8,490,877 B2 | 7/2013 | Kearney | |
| 8,517,271 B2 | 8/2013 | Kotlarsky et al. | |
| 8,523,076 B2 | 9/2013 | Good | |
| 8,528,818 B2 | 9/2013 | Ehrhart et al. | |
| 8,544,737 B2 | 10/2013 | Gomez et al. | |
| 8,548,420 B2 | 10/2013 | Grunow et al. | |
| 8,550,335 B2 | 10/2013 | Samek et al. | |
| 8,550,354 B2 | 10/2013 | Gannon et al. | |
| 8,550,357 B2 | 10/2013 | Kearney | |
| 8,556,174 B2 | 10/2013 | Kosecki et al. | |
| 8,556,176 B2 | 10/2013 | Van Horn et al. | |
| 8,556,177 B2 | 10/2013 | Hussey et al. | |
| 8,559,767 B2 | 10/2013 | Barber et al. | |
| 8,561,895 B2 | 10/2013 | Gomez et al. | |
| 8,561,903 B2 | 10/2013 | Sauerwein | |
| 8,561,905 B2 | 10/2013 | Edmonds et al. | |
| 8,565,107 B2 | 10/2013 | Pease et al. | |
| 8,571,307 B2 | 10/2013 | Li et al. | |
| 8,579,200 B2 | 11/2013 | Samek et al. | |
| 8,583,924 B2 | 11/2013 | Caballero et al. | |
| 8,584,945 B2 | 11/2013 | Wang et al. | |
| 8,587,595 B2 | 11/2013 | Wang | |
| 8,587,697 B2 | 11/2013 | Hussey et al. | |
| 8,588,869 B2 | 11/2013 | Sauerwein et al. | |
| 8,590,789 B2 | 11/2013 | Nahill et al. | |
| 8,596,539 B2 | 12/2013 | Havens et al. | |
| 8,596,542 B2 | 12/2013 | Havens et al. | |
| 8,596,543 B2 | 12/2013 | Havens et al. | |
| 8,599,271 B2 | 12/2013 | Havens et al. | |
| 8,599,957 B2 | 12/2013 | Peake et al. | |
| 8,600,158 B2 | 12/2013 | Li et al. | |
| 8,600,167 B2 | 12/2013 | Showering | |
| 8,602,309 B2 | 12/2013 | Longacre et al. | |
| 8,608,053 B2 | 12/2013 | Meier et al. | |
| 8,608,071 B2 | 12/2013 | Liu et al. | |
| 8,611,309 B2 | 12/2013 | Wang et al. | |
| 8,615,487 B2 | 12/2013 | Gomez et al. | |
| 8,621,123 B2 | 12/2013 | Caballero | |
| 8,622,303 B2 | 1/2014 | Meier et al. | |
| 8,628,013 B2 | 1/2014 | Ding | |
| 8,628,015 B2 | 1/2014 | Wang et al. | |
| 8,628,016 B2 | 1/2014 | Winegar | |
| 8,629,926 B2 | 1/2014 | Wang | |
| 8,630,491 B2 | 1/2014 | Longacre et al. | |
| 8,635,309 B2 | 1/2014 | Berthiaume et al. | |
| 8,636,200 B2 | 1/2014 | Kearney | |
| 8,636,212 B2 | 1/2014 | Nahill et al. | |
| 8,636,215 B2 | 1/2014 | Ding et al. | |
| 8,636,224 B2 | 1/2014 | Wang | |
| 8,638,806 B2 | 1/2014 | Wang et al. | |
| 8,640,958 B2 | 2/2014 | Lu et al. | |
| 8,640,960 B2 | 2/2014 | Wang et al. | |
| 8,643,717 B2 | 2/2014 | Li et al. | |
| 8,646,692 B2 | 2/2014 | Meier et al. | |
| 8,646,694 B2 | 2/2014 | Wang et al. | |
| 8,657,200 B2 | 2/2014 | Ren et al. | |
| 8,659,397 B2 | 2/2014 | Vargo et al. | |
| 8,668,149 B2 | 3/2014 | Good | |
| 8,678,285 B2 | 3/2014 | Kearney | |
| 8,678,286 B2 | 3/2014 | Smith et al. | |
| 8,682,077 B1 | 3/2014 | Longacre | |
| D702,237 S | 4/2014 | Oberpriller et al. | |
| 8,687,282 B2 | 4/2014 | Feng et al. | |
| 8,692,927 B2 | 4/2014 | Pease et al. | |
| 8,695,880 B2 | 4/2014 | Bremer et al. | |
| 8,698,949 B2 | 4/2014 | Grunow et al. | |
| 8,702,000 B2 | 4/2014 | Barber et al. | |
| 8,717,494 B2 | 5/2014 | Gannon | |
| 8,720,783 B2 | 5/2014 | Biss et al. | |
| 8,723,804 B2 | 5/2014 | Fletcher et al. | |
| 8,723,904 B2 | 5/2014 | Marty et al. | |
| 8,727,223 B2 | 5/2014 | Wang | |
| 8,740,082 B2 | 6/2014 | Wilz | |
| 8,740,085 B2 | 6/2014 | Furlong et al. | |
| 8,746,563 B2 | 6/2014 | Hennick et al. | |
| 8,750,445 B2 | 6/2014 | Peake et al. | |
| 8,752,766 B2 | 6/2014 | Xian et al. | |
| 8,756,059 B2 | 6/2014 | Braho et al. | |
| 8,757,495 B2 | 6/2014 | Qu et al. | |
| 8,760,563 B2 | 6/2014 | Koziol et al. | |
| 8,736,909 B2 | 7/2014 | Reed et al. | |
| 8,777,108 B2 | 7/2014 | Coyle | |
| 8,777,109 B2 | 7/2014 | Oberpriller et al. | |
| 8,779,898 B2 | 7/2014 | Havens et al. | |
| 8,781,520 B2 | 7/2014 | Payne et al. | |
| 8,783,573 B2 | 7/2014 | Havens et al. | |
| 8,789,757 B2 | 7/2014 | Barten | |
| 8,789,758 B2 | 7/2014 | Hawley et al. | |
| 8,789,759 B2 | 7/2014 | Xian et al. | |
| 8,794,520 B2 | 8/2014 | Wang et al. | |
| 8,794,522 B2 | 8/2014 | Ehrhart | |
| 8,794,525 B2 | 8/2014 | Amundsen et al. | |
| 8,794,526 B2 | 8/2014 | Wang et al. | |
| 8,798,367 B2 | 8/2014 | Ellis | |
| 8,807,431 B2 | 8/2014 | Wang et al. | |
| 8,807,432 B2 | 8/2014 | Van Horn et al. | |
| 8,820,630 B2 | 9/2014 | Qu et al. | |
| 8,822,848 B2 | 9/2014 | Meagher | |
| 8,824,692 B2 | 9/2014 | Sheerin et al. | |
| 8,824,696 B2 | 9/2014 | Braho | |
| 8,842,849 B2 | 9/2014 | Wahl et al. | |
| 8,844,822 B2 | 9/2014 | Kotlarsky et al. | |
| 8,844,823 B2 | 9/2014 | Fritz et al. | |
| 8,849,019 B2 | 9/2014 | Li et al. | |
| D716,285 S | 10/2014 | Chaney et al. | |
| 8,851,383 B2 | 10/2014 | Yeakley et al. | |
| 8,854,633 B2 | 10/2014 | Laffargue | |
| 8,866,963 B2 | 10/2014 | Grunow et al. | |
| 8,868,421 B2 | 10/2014 | Braho et al. | |
| 8,868,519 B2 | 10/2014 | Maloy et al. | |
| 8,868,802 B2 | 10/2014 | Barten | |
| 8,868,803 B2 | 10/2014 | Bremer et al. | |
| 8,870,074 B1 | 10/2014 | Gannon | |
| 8,879,639 B2 | 11/2014 | Sauerwein | |
| 8,880,426 B2 | 11/2014 | Smith | |
| 8,881,983 B2 | 11/2014 | Havens et al. | |
| 8,881,987 B2 | 11/2014 | Wang | |
| 8,903,172 B2 | 12/2014 | Smith | |
| 8,908,995 B2 | 12/2014 | Benos et al. | |
| 8,910,870 B2 | 12/2014 | Li et al. | |
| 8,910,875 B2 | 12/2014 | Ren et al. | |
| 8,914,290 B2 | 12/2014 | Hendrickson et al. | |
| 8,914,788 B2 | 12/2014 | Pettinelli et al. | |
| 8,915,439 B2 | 12/2014 | Feng et al. | |
| 8,915,444 B2 | 12/2014 | Havens et al. | |
| 8,916,789 B2 | 12/2014 | Woodburn | |
| 8,918,250 B2 | 12/2014 | Hollifield | |
| 8,918,564 B2 | 12/2014 | Caballero | |
| 8,925,818 B2 | 1/2015 | Kosecki et al. | |
| 8,939,374 B2 | 1/2015 | Jovanovski et al. | |
| 8,942,480 B2 | 1/2015 | Ellis | |
| 8,944,313 B2 | 2/2015 | Williams et al. | |
| 8,944,327 B2 | 2/2015 | Meier et al. | |
| 8,944,332 B2 | 2/2015 | Harding et al. | |
| 8,950,678 B2 | 2/2015 | Germaine et al. | |
| D723,560 S | 3/2015 | Zhou et al. | |
| 8,967,468 B2 | 3/2015 | Gomez et al. | |

(56) References Cited

U.S. PATENT DOCUMENTS

| | | | |
|---|---|---|---|
| 8,971,346 B2 | 3/2015 | Sevier |
| 8,976,030 B2 | 3/2015 | Cunningham et al. |
| 8,976,368 B2 | 3/2015 | Akel et al. |
| 8,978,981 B2 | 3/2015 | Guan |
| 8,978,983 B2 | 3/2015 | Bremer et al. |
| 8,978,984 B2 | 3/2015 | Hennick et al. |
| 8,985,456 B2 | 3/2015 | Zhu et al. |
| 8,985,457 B2 | 3/2015 | Soule et al. |
| 8,985,459 B2 | 3/2015 | Kearney et al. |
| 8,985,461 B2 | 3/2015 | Gelay et al. |
| 8,988,578 B2 | 3/2015 | Showering |
| 8,988,590 B2 | 3/2015 | Gillet et al. |
| 8,991,704 B2 | 3/2015 | Hopper et al. |
| 8,996,194 B2 | 3/2015 | Davis et al. |
| 8,996,384 B2 | 3/2015 | Funyak et al. |
| 8,998,091 B2 | 4/2015 | Edmonds et al. |
| 9,002,641 B2 | 4/2015 | Showering |
| 9,007,368 B2 | 4/2015 | Laffargue et al. |
| 9,010,641 B2 | 4/2015 | Qu et al. |
| 9,015,513 B2 | 4/2015 | Murawski et al. |
| 9,016,576 B2 | 4/2015 | Brady et al. |
| D730,357 S | 5/2015 | Fitch et al. |
| 9,022,288 B2 | 5/2015 | Nahill et al. |
| 9,030,964 B2 | 5/2015 | Essinger et al. |
| 9,033,240 B2 | 5/2015 | Smith et al. |
| 9,033,242 B2 | 5/2015 | Gillet et al. |
| 9,036,054 B2 | 5/2015 | Koziol et al. |
| 9,037,344 B2 | 5/2015 | Chamberlin |
| 9,038,911 B2 | 5/2015 | Xian et al. |
| 9,038,915 B2 | 5/2015 | Smith |
| D730,901 S | 6/2015 | Oberpriller et al. |
| D730,902 S | 6/2015 | Fitch et al. |
| D733,112 S | 6/2015 | Chaney et al. |
| 9,047,098 B2 | 6/2015 | Barten |
| 9,047,359 B2 | 6/2015 | Caballero et al. |
| 9,047,420 B2 | 6/2015 | Caballero |
| 9,047,525 B2 | 6/2015 | Barber |
| 9,047,531 B2 | 6/2015 | Showering et al. |
| 9,049,640 B2 | 6/2015 | Wang et al. |
| 9,053,055 B2 | 6/2015 | Caballero |
| 9,053,378 B1 | 6/2015 | Hou et al. |
| 9,053,380 B2 | 6/2015 | Xian et al. |
| 9,057,641 B2 | 6/2015 | Amundsen et al. |
| 9,058,526 B2 | 6/2015 | Powilleit |
| 9,064,165 B2 | 6/2015 | Havens et al. |
| 9,064,167 B2 | 6/2015 | Xian et al. |
| 9,064,168 B2 | 6/2015 | Todeschini et al. |
| 9,064,254 B2 | 6/2015 | Todeschini et al. |
| 9,066,032 B2 | 6/2015 | Wang |
| 9,070,032 B2 | 6/2015 | Corcoran |
| D734,339 S | 7/2015 | Zhou et al. |
| D734,751 S | 7/2015 | Oberpriller et al. |
| 9,082,023 B2 | 7/2015 | Feng et al. |
| 2007/0063048 A1 | 3/2007 | Havens et al. |
| 2009/0134221 A1 | 5/2009 | Zhu et al. |
| 2010/0177076 A1 | 7/2010 | Essinger et al. |
| 2010/0177080 A1 | 7/2010 | Essinger et al. |
| 2010/0177707 A1 | 7/2010 | Essinger et al. |
| 2010/0177749 A1 | 7/2010 | Essinger et al. |
| 2011/0169999 A1 | 7/2011 | Grunow et al. |
| 2011/0202554 A1 | 8/2011 | Powilleit et al. |
| 2012/0111946 A1 | 5/2012 | Golant |
| 2012/0168512 A1 | 7/2012 | Kotlarsky et al. |
| 2012/0193423 A1 | 8/2012 | Samek |
| 2012/0203647 A1 | 8/2012 | Smith |
| 2012/0223141 A1 | 9/2012 | Good et al. |
| 2012/0306450 A1* | 12/2012 | Nakayama ............ G06F 1/263 320/134 |
| 2013/0043312 A1 | 2/2013 | Van Horn |
| 2013/0063097 A1* | 3/2013 | Valentine ............ G06F 1/3212 320/136 |
| 2013/0075168 A1 | 3/2013 | Amundsen et al. |
| 2013/0175341 A1 | 7/2013 | Kearney et al. |
| 2013/0175343 A1 | 7/2013 | Good |
| 2013/0257744 A1 | 10/2013 | Daghigh et al. |
| 2013/0257759 A1 | 10/2013 | Daghigh |
| 2013/0270346 A1 | 10/2013 | Xian et al. |
| 2013/0287258 A1 | 10/2013 | Kearney |
| 2013/0292475 A1 | 11/2013 | Kotlarsky et al. |
| 2013/0292477 A1 | 11/2013 | Hennick et al. |
| 2013/0293539 A1 | 11/2013 | Hunt et al. |
| 2013/0293540 A1 | 11/2013 | Laffargue et al. |
| 2013/0306728 A1 | 11/2013 | Thuries et al. |
| 2013/0306731 A1 | 11/2013 | Pedrao |
| 2013/0307964 A1 | 11/2013 | Bremer et al. |
| 2013/0308625 A1 | 11/2013 | Corcoran |
| 2013/0313324 A1 | 11/2013 | Koziol et al. |
| 2013/0313325 A1 | 11/2013 | Wilz et al. |
| 2013/0342173 A1* | 12/2013 | Das ............... H02J 7/041 320/162 |
| 2013/0342717 A1 | 12/2013 | Havens et al. |
| 2014/0001267 A1 | 1/2014 | Giordano et al. |
| 2014/0002828 A1 | 1/2014 | Laffargue et al. |
| 2014/0008439 A1 | 1/2014 | Wang |
| 2014/0025584 A1 | 1/2014 | Liu et al. |
| 2014/0034734 A1 | 2/2014 | Sauerwein |
| 2014/0036848 A1 | 2/2014 | Pease et al. |
| 2014/0039693 A1 | 2/2014 | Havens et al. |
| 2014/0042814 A1 | 2/2014 | Kather et al. |
| 2014/0049120 A1 | 2/2014 | Kohtz et al. |
| 2014/0049635 A1 | 2/2014 | Laffargue et al. |
| 2014/0061306 A1 | 3/2014 | Wu et al. |
| 2014/0063289 A1 | 3/2014 | Hussey et al. |
| 2014/0066136 A1 | 3/2014 | Sauerwein et al. |
| 2014/0067692 A1 | 3/2014 | Ye et al. |
| 2014/0070005 A1 | 3/2014 | Nahill et al. |
| 2014/0071840 A1 | 3/2014 | Venancio |
| 2014/0074746 A1 | 3/2014 | Wang |
| 2014/0076974 A1 | 3/2014 | Havens et al. |
| 2014/0078341 A1 | 3/2014 | Havens et al. |
| 2014/0078342 A1 | 3/2014 | Li et al. |
| 2014/0078345 A1 | 3/2014 | Showering |
| 2014/0098792 A1 | 4/2014 | Wang et al. |
| 2014/0100774 A1 | 4/2014 | Showering |
| 2014/0100813 A1 | 4/2014 | Showering |
| 2014/0103115 A1 | 4/2014 | Meier et al. |
| 2014/0104413 A1 | 4/2014 | McCloskey et al. |
| 2014/0104414 A1 | 4/2014 | McCloskey et al. |
| 2014/0104416 A1 | 4/2014 | Li et al. |
| 2014/0104451 A1 | 4/2014 | Todeschini et al. |
| 2014/0106594 A1 | 4/2014 | Skvoretz |
| 2014/0106725 A1 | 4/2014 | Sauerwein |
| 2014/0108010 A1 | 4/2014 | Maltseff et al. |
| 2014/0108402 A1 | 4/2014 | Gomez et al. |
| 2014/0108682 A1 | 4/2014 | Caballero |
| 2014/0110485 A1 | 4/2014 | Toa et al. |
| 2014/0114530 A1 | 4/2014 | Fitch et al. |
| 2014/0121438 A1 | 5/2014 | Kearney |
| 2014/0121445 A1 | 5/2014 | Ding et al. |
| 2014/0124577 A1 | 5/2014 | Wang et al. |
| 2014/0124579 A1 | 5/2014 | Ding |
| 2014/0125842 A1 | 5/2014 | Winegar |
| 2014/0125853 A1 | 5/2014 | Wang |
| 2014/0125999 A1 | 5/2014 | Longacre et al. |
| 2014/0129378 A1 | 5/2014 | Richardson |
| 2014/0131441 A1 | 5/2014 | Nahill et al. |
| 2014/0131443 A1 | 5/2014 | Smith |
| 2014/0131444 A1 | 5/2014 | Wang |
| 2014/0131448 A1 | 5/2014 | Xian et al. |
| 2014/0133379 A1 | 5/2014 | Wang et al. |
| 2014/0136208 A1 | 5/2014 | Maltseff et al. |
| 2014/0140585 A1 | 5/2014 | Wang |
| 2014/0151453 A1 | 6/2014 | Meier et al. |
| 2014/0152882 A1 | 6/2014 | Samek et al. |
| 2014/0158770 A1 | 6/2014 | Sevier et al. |
| 2014/0159869 A1 | 6/2014 | Zumsteg et al. |
| 2014/0166755 A1 | 6/2014 | Liu et al. |
| 2014/0166757 A1 | 6/2014 | Smith |
| 2014/0166759 A1 | 6/2014 | Liu et al. |
| 2014/0168787 A1 | 6/2014 | Wang et al. |
| 2014/0175165 A1 | 6/2014 | Havens et al. |
| 2014/0175172 A1 | 6/2014 | Jovanovski et al. |
| 2014/0188413 A1* | 7/2014 | Bourilkov ......... G01R 31/3627 702/63 |

(56) References Cited

U.S. PATENT DOCUMENTS

| | | |
|---|---|---|
| 2014/0191644 A1 | 7/2014 | Chaney |
| 2014/0191913 A1 | 7/2014 | Ge et al. |
| 2014/0197238 A1 | 7/2014 | Lui et al. |
| 2014/0197239 A1 | 7/2014 | Havens et al. |
| 2014/0197304 A1 | 7/2014 | Feng et al. |
| 2014/0203087 A1 | 7/2014 | Smith et al. |
| 2014/0204268 A1 | 7/2014 | Grunow et al. |
| 2014/0214631 A1 | 7/2014 | Hansen |
| 2014/0217166 A1 | 8/2014 | Berthiaume et al. |
| 2014/0217180 A1 | 8/2014 | Liu |
| 2014/0231500 A1 | 8/2014 | Ehrhart et al. |
| 2014/0232930 A1 | 8/2014 | Anderson |
| 2014/0247315 A1 | 9/2014 | Marty et al. |
| 2014/0263493 A1 | 9/2014 | Amurgis et al. |
| 2014/0263645 A1 | 9/2014 | Smith et al. |
| 2014/0270196 A1 | 9/2014 | Braho et al. |
| 2014/0270229 A1 | 9/2014 | Braho |
| 2014/0278387 A1 | 9/2014 | DiGregorio |
| 2014/0282210 A1 | 9/2014 | Bianconi |
| 2014/0284384 A1 | 9/2014 | Lu et al. |
| 2014/0288933 A1 | 9/2014 | Braho et al. |
| 2014/0297058 A1 | 10/2014 | Barker et al. |
| 2014/0299665 A1 | 10/2014 | Barber et al. |
| 2014/0312121 A1 | 10/2014 | Lu et al. |
| 2014/0319220 A1 | 10/2014 | Coyle |
| 2014/0319221 A1 | 10/2014 | Oberpriller et al. |
| 2014/0326787 A1 | 11/2014 | Barten |
| 2014/0332590 A1 | 11/2014 | Wang et al. |
| 2014/0344943 A1 | 11/2014 | Todeschini et al. |
| 2014/0346233 A1 | 11/2014 | Liu et al. |
| 2014/0351317 A1 | 11/2014 | Smith et al. |
| 2014/0353373 A1 | 12/2014 | Van Horn et al. |
| 2014/0361073 A1 | 12/2014 | Qu et al. |
| 2014/0361082 A1 | 12/2014 | Xian et al. |
| 2014/0362184 A1 | 12/2014 | Jovanovski et al. |
| 2014/0363015 A1 | 12/2014 | Braho |
| 2014/0369511 A1 | 12/2014 | Sheerin et al. |
| 2014/0374483 A1 | 12/2014 | Lu |
| 2014/0374485 A1 | 12/2014 | Xian et al. |
| 2015/0001301 A1 | 1/2015 | Ouyang |
| 2015/0001304 A1 | 1/2015 | Todeschini |
| 2015/0003673 A1 | 1/2015 | Fletcher |
| 2015/0009338 A1 | 1/2015 | Laffargue et al. |
| 2015/0009610 A1 | 1/2015 | London et al. |
| 2015/0014416 A1 | 1/2015 | Kotlarsky et al. |
| 2015/0021397 A1 | 1/2015 | Rueblinger et al. |
| 2015/0028102 A1 | 1/2015 | Ren et al. |
| 2015/0028103 A1 | 1/2015 | Jiang |
| 2015/0028104 A1 | 1/2015 | Ma et al. |
| 2015/0029002 A1 | 1/2015 | Yeakley et al. |
| 2015/0032709 A1 | 1/2015 | Maloy et al. |
| 2015/0039309 A1 | 2/2015 | Braho et al. |
| 2015/0040378 A1 | 2/2015 | Saber et al. |
| 2015/0048168 A1 | 2/2015 | Fritz et al. |
| 2015/0048837 A1* | 2/2015 | Oh ................. H02J 7/0021 324/427 |
| 2015/0049347 A1 | 2/2015 | Laffargue et al. |
| 2015/0051992 A1 | 2/2015 | Smith |
| 2015/0053766 A1 | 2/2015 | Havens et al. |
| 2015/0053768 A1 | 2/2015 | Wang et al. |
| 2015/0053769 A1 | 2/2015 | Thuries et al. |
| 2015/0062366 A1 | 3/2015 | Liu et al. |
| 2015/0063215 A1 | 3/2015 | Wang |
| 2015/0063676 A1 | 3/2015 | Lloyd et al. |
| 2015/0069130 A1 | 3/2015 | Gannon |
| 2015/0071818 A1 | 3/2015 | Todeschini |
| 2015/0083800 A1 | 3/2015 | Li et al. |
| 2015/0086114 A1 | 3/2015 | Todeschini |
| 2015/0088522 A1 | 3/2015 | Hendrickson et al. |
| 2015/0096872 A1 | 4/2015 | Woodburn |
| 2015/0099557 A1 | 4/2015 | Pettinelli et al. |
| 2015/0100196 A1 | 4/2015 | Hollifield |
| 2015/0102109 A1 | 4/2015 | Huck |
| 2015/0115035 A1 | 4/2015 | Meier et al. |
| 2015/0127791 A1 | 5/2015 | Kosecki et al. |
| 2015/0128116 A1 | 5/2015 | Chen et al. |
| 2015/0129659 A1 | 5/2015 | Feng et al. |
| 2015/0133047 A1 | 5/2015 | Smith et al. |
| 2015/0134470 A1 | 5/2015 | Hejl et al. |
| 2015/0136851 A1 | 5/2015 | Harding et al. |
| 2015/0136854 A1 | 5/2015 | Lu et al. |
| 2015/0142492 A1 | 5/2015 | Kumar |
| 2015/0144692 A1 | 5/2015 | Hejl |
| 2015/0144698 A1 | 5/2015 | Teng et al. |
| 2015/0144701 A1 | 5/2015 | Xian et al. |
| 2015/0149946 A1 | 5/2015 | Benos et al. |
| 2015/0161429 A1 | 6/2015 | Xian |
| 2015/0169925 A1 | 6/2015 | Chen et al. |
| 2015/0169929 A1 | 6/2015 | Williams et al. |
| 2015/0186703 A1 | 7/2015 | Chen et al. |
| 2015/0193644 A1 | 7/2015 | Kearney et al. |
| 2015/0193645 A1 | 7/2015 | Colavito et al. |
| 2015/0199957 A1 | 7/2015 | Funyak et al. |
| 2015/0204671 A1 | 7/2015 | Showering |
| 2015/0241519 A1* | 8/2015 | Lee ................. G01R 31/3606 702/63 |
| 2016/0141893 A1* | 5/2016 | Lee ................. H02J 7/007 320/107 |
| 2016/0266979 A1* | 9/2016 | Glover ............. G06F 9/30083 |
| 2016/0301223 A1* | 10/2016 | Kondo ............. H02J 7/0029 |
| 2016/0359344 A1* | 12/2016 | Chin ................ G01R 31/362 |

FOREIGN PATENT DOCUMENTS

| | | |
|---|---|---|
| WO | 2014019130 A1 | 2/2014 |
| WO | 2014110495 A1 | 7/2014 |

OTHER PUBLICATIONS

U.S. Appl. No. 14/264,173 for Autofocus Lens System for Indicia Readers filed Apr. 29, 2014, (Ackley et al.); 39 pages.

U.S. Appl. No. 14/453,019 for Dimensioning System With Guided Alignment, filed Aug. 6, 2014 (Li et al.); 31 pages.

U.S. Appl. No. 14/452,697 for Interactive Indicia Reader, filed Aug. 6, 2014, (Todeschini); 32 pages.

U.S. Appl. No. 14/231,898 for Hand-Mounted Indicia-Reading Device with Finger Motion Triggering filed Apr. 1, 2014 (Van Horn et al.); 36 pages.

U.S. Appl. No. 14/715,916 for Evaluating Image Values filed May 19, 2015 (Ackley); 60 pages.

U.S. Appl. No. 14/513,808 for Identifying Inventory Items in a Storage Facility filed Oct. 14, 2014 (Singel et al.); 51 pages.

U.S. Appl. No. 29/458,405 for an Electronic Device, filed Jun. 19, 2013 (Fitch et al.); 22 pages.

U.S. Appl. No. 29/459,620 for an Electronic Device Enclosure, filed Jul. 2, 2013 (London et al.); 21 pages.

U.S. Appl. No. 14/483,056 for Variable Depth of Field Barcode Scanner filed Sep. 10, 2014 (McCloskey et al.); 29 pages.

U.S. Appl. No. 14/531,154 for Directing an Inspector Through an Inspection filed Nov. 3, 2014 (Miller et al.); 53 pages.

U.S. Appl. No. 29/525,068 for Tablet Computer With Removable Scanning Device filed Apr. 27, 2015 (Schulte et al.); 19 pages.

U.S. Appl. No. 29/468,118 for an Electronic Device Case, filed Sep. 26, 2013 (Oberpriller et al.); 44 pages.

U.S. Appl. No. 14/340,627 for an Axially Reinforced Flexible Scan Element, filed Jul. 25, 2014 (Reublinger et al.); 41 pages.

U.S. Appl. No. 14/676,327 for Device Management Proxy for Secure Devices filed Apr. 1, 2015 (Yeakley et al.); 50 pages.

U.S. Appl. No. 14/257,364 for Docking System and Method Using Near Field Communication filed Apr. 21, 2014 (Showering); 31 pages.

U.S. Appl. No. 14/327,827 for a Mobile-Phone Adapter for Electronic Transactions, filed Jul. 10, 2014 (Hejl); 25 pages.

U.S. Appl. No. 14/334,934 for a System and Method for Indicia Verification, filed Jul. 18, 2014 (Hejl); 38 pages.

U.S. Appl. No. 29/530,600 for Cyclone filed Jun. 18, 2015 (Vargo et al); 16 pages.

U.S. Appl. No. 14/707,123 for Application Independent DEX/UCS Interface filed May 8, 2015 (Pape); 47 pages.

(56) References Cited

OTHER PUBLICATIONS

U.S. Appl. No. 14/283,282 for Terminal Having Illumination and Focus Control filed May 21, 2014 (Liu et al.); 31 pages.
U.S. Appl. No. 14/619,093 for Methods for Training a Speech Recognition System filed Feb. 11, 2015 (Pecorari); 35 pages.
U.S. Appl. No. 29/524,186 for Scanner filed Apr. 17, 2015 (Zhou et al.); 17 pages.
U.S. Appl. No. 14/705,407 for Method and System to Protect Software-Based Network-Connected Devices From Advanced Persistent Threat filed May 6, 2015 (Hussey et al.); 42 pages.
U.S. Appl. No. 14/614,706 for Device for Supporting an Electronic Tool on a User's Hand filed Feb. 5, 2015 (Oberpriller et al.); 33 pages.
U.S. Appl. No. 14/628,708 for Device, System, and Method for Determining the Status of Checkout Lanes filed Feb. 23, 2015 (Todeschini); 37 pages.
U.S. Appl. No. 14/704,050 for Intermediate Linear Positioning filed May 5, 2015 (Charpentier et al.); 60 pages.
U.S. Appl. No. 14/529,563 for Adaptable Interface for a Mobile Computing Device filed Oct. 31, 2014 (Schoon et al.); 36 pages.
U.S. Appl. No. 14/705,012 for Hands-Free Human Machine Interface Responsive to a Driver of a Vehicle filed May 6, 2015 (Fitch et al.); 44 pages.
U.S. Appl. No. 14/715,672 for Augumented Reality Enabled Hazard Display filed May 19, 2015 (Venkatesha et al.); 35 pages.
U.S. Appl. No. 14/695,364 for Medication Management System filed Apr. 24, 2015 (Sewell et al.) 44 pages.
U.S. Appl. No. 14/664,063 for Method and Application for Scanning a Barcode With a Smart Device While Continuously Running and Displaying an Application on the Smart Device Display filed Mar. 20, 2015 (Todeschini); 37 pages.
U.S. Appl. No. 14/735,717 for Indicia-Reading Systems Having an Interface With a User's Nervous System filed Jun. 10, 2015 (Todeschini); 39 pages.
U.S. Appl. No. 14/527,191 for Method and System for Recognizing Speech Using Wildcards in an Expected Response filed Oct. 29, 2014 (Braho et al.); 45 pages.
U.S. Appl. No. 14/702,110 for System and Method for Regulating Barcode Data Injection Into a Running Application on a Smart Device filed May 1, 2015 (Todeschini et al.); 38 pages.
U.S. Appl. No. 14/535,764 for Concatenated Expected Responses for Speech Recognition filed Nov. 7, 2014 (Braho et al.); 51 pages.
U.S. Appl. No. 14/687,289 for System for Communication Via a Peripheral Hub filed Apr. 15, 2015 (Kohtz et al.); 37 pages
U.S. Appl. No. 14/747,197 for Optical Pattern Projector filed Jun. 23, 2015 (Thuries et al.); 33 pages
U.S. Appl. No. 14/674,329 for Aimer for Barcode Scanning filed Mar. 31, 2015 (Bidwell); 36 pages.
U.S. Appl. No. 14/702,979 for Tracking Battery Conditions filed May 4, 2015 (Young et al.); 70 pages.
U.S. Appl. No. 29/529,441 for Indicia Reading Device filed Jun. 8, 2015 (Zhou et al.); 14 pages.
U.S. Appl. No. 14/747,490 for Dual-Projector Three-Dimensional Scanner filed Jun. 23, 2015 (Jovanovski et al.); 40 pages.
U.S. Appl. No. 14/740,320 for Tactile Switch for a Mobile Electronic Device filed Jun. 16, 2015 (Barndringa); 38 pages.
U.S. Appl. No. 14/695,923 for Secure Unattended Network Authentication filed Apr. 24, 2015 (Kubler et al.); 52 pages.
U.S. Appl. No. 14/740,373 for Calibrating a Volume Dimensioner filed Jun. 16, 2015 (Ackley et al.); 63 pages.
U.S. Appl. No. 13/367,978, filed Feb. 7, 2012, (Feng et al.); now abandoned.
U.S. Appl. No. 14/462,801 for Mobile Computing Device With Data Cognition Software, filed Aug. 19, 2014 (Todeschini et al.); 38 pages.
U.S. Appl. No. 14/596,757 for System and Method for Detecting Barcode Printing Errors filed Jan. 14, 2015 (Ackley); 41 pages.
U.S. Appl. No. 14/277,337 for Multipurpose Optical Reader, filed May 14, 2014 (Jovanovski et al.); 59 pages.
U.S. Appl. No. 14/200,405 for Indicia Reader for Size-Limited Applications filed Mar. 7, 2014 (Feng et al.); 42 pages.
U.S. Appl. No. 14/662,922 for Multifunction Point of Sale System filed Mar. 19, 2015 (Van Horn et al.); 41 pages.
U.S. Appl. No. 14/446,391 for Multifunction Point of Sale Apparatus With Optical Signature Capture filed Jul. 30, 2014 (Good et al.); 37 pages.
U.S. Appl. No. 29/528,165 for In-Counter Barcode Scanner filed May 27, 2015 (Oberpriller et al.); 13 pages.
U.S. Appl. No. 29/528,890 for Mobile Computer Housing filed Jun. 2, 2015 (Fitch et al.); 61 pages.
U.S. Appl. No. 14/614,796 for Cargo Apportionment Techniques filed Feb. 5, 2015 (Morton et al.); 56 pages.
U.S. Appl. No. 29/516,892 for Table Computer filed Feb. 6, 2015 (Bidwell et al.); 13 pages.
U.S. Appl. No. 29/523,098 for Handle for a Tablet Computer filed Apr. 7, 2015 (Bidwell et al.); 17 pages.
U.S. Appl. No. 14/578,627 for Safety System and Method filed Dec. 22, 2014 (Ackley et al.); 32 pages.
U.S. Appl. No. 14/573,022 for Dynamic Diagnostic Indicator Generation filed Dec. 17, 2014 (Goldsmith); 43 pages.
U.S. Appl. No. 14/529,857 for Barcode Reader With Security Features filed Oct. 31, 2014 (Todeschini et al.); 32 pages.
U.S. Appl. No. 14/519,195 for Handheld Dimensioning System With Feedback filed Oct. 21, 2014 (Laffargue et al.); 39 pages.
U.S. Appl. No. 14/519,211 for System and Method for Dimensioning filed Oct. 21, 2014 (Ackley et al.); 33 pages.
U.S. Appl. No. 14/519,233 for Handheld Dimensioner With Data-Quality Indication filed Oct. 21, 2014 (Laffargue et al.); 36 pages
U.S. Appl. No. 14/533,319 for Barcode Scanning System Using Wearable Device With Embedded Camera filed Nov. 5, 2014 (Todeschini); 29 pages.
U.S. Appl. No. 14/748,446 for Cordless Indicia Reader With a Multifunction Coil for Wireless Charging and EAS Deactivation, filed Jun. 24, 2015 (Xie et al.); 34 pages
U.S. Appl. No. 29/528,590 for Electronic Device filed May 29, 2015 (Fitch et al.); 9 pages.
U.S. Appl. No. 14/519,249 for Handheld Dimensioning System With Measurement-Conformance Feedback filed Oct. 21, 2014 (Ackley et al.); 36 pages.
U.S. Appl. No. 29/519,017 for Scanner filed Mar. 2, 2015 (Zhou et al.); 11 pages.
U.S. Appl. No. 14/398,542 for Portable Electronic Devices Having a Separate Location Trigger Unit for Use in Controlling an Application Unit filed Nov. 3, 2014 (Bian et al.); 22 pages.
U.S. Appl. No. 14/405,278 for Design Pattern for Secure Store filed March 9, 2015 (Zhu et al.); 23 pages.
U.S. Appl. No. 14/590,024 for Shelving and Package Locating Systems for Delivery Vehicles filed Jan. 6, 2015 (Payne); 31 pages.
U.S. Appl. No. 14/568,305 for Auto-Contrast Viewfinder for an Indicia Reader filed Dec. 12, 2014 (Todeschini); 29 pages.
U.S. Appl. No. 29/526,918 for Charging Base filed May 14, 2015 (Fitch et al.); 10 pages.
U.S. Appl. No. 14/580,262 for Media Gate for Thermal Transfer Printers filed Dec. 23, 2014 (Bowles); 36 pages.

\* cited by examiner

| COUNT 302 | LAST DATE UPDATED 304 | CAPACITY (PASSED CHARGE VALUE) 306 | TYPE 308 |
|---|---|---|---|
| 3 | 01/23/2014 5:16:36 | 3800 mAHrs | FULL CAPACITY |
| 40 | 03/05/2014 17:48:15 | 2100 mAHrs | MINIMUM CAPACITY |

FIG. 3

USEFUL BATTERY CAPACITY / STATE OF HEALTH GAUGE

FIELD OF THE INVENTION

The present invention relates to the state of health and useful capacity of battery packs.

BACKGROUND

The life of a battery is a function of how the battery is used. As battery capacity is diminished, the discharge time gets shorter. Normal batteries provide no information to the user regarding this natural process, and so it becomes difficult for users to know when it is time to replace a battery.

Battery gas gauges are devices that are used to create "smart" batteries that are able to give the user more information regarding the useful capacity of a battery as well as the overall state of health of the battery.

Battery gas gauges provide accurate information on useful capacity and the state of health of a battery when the real-world use case conforms to the battery gas gauge's specific use case firmware design. Understandably, though, real-world use cases do not always conform to these idealized designs. As a results, the state of health and useful capacity information for a battery as reported by the battery gas gauge can become inaccurate as the device, battery, and battery gas gauge are increasingly used in real-world situations.

Therefore, a need exists for a battery gas gauge that tracks discharge and charge events to report the actual, real-world capacity of a battery. This information can be used to provide recommendations on replacement of the battery, and it can also provide workflow improvement information.

SUMMARY

Accordingly, one aspect of the present invention discloses a device comprising: a battery; a battery gauge; a display; storage; an input/output subsystem; one or more processors; and memory containing instructions executable by the one or more processors whereby the device is operable to: determine the capacity of a battery in response to one or more discharge events measured by the battery gauge; and store, in the storage, information related to the capacity of the battery based on the one or more discharge events.

In other exemplary embodiments, the information related to the capacity of the battery comprises: an indication of the type of capacity; a counter associated with the type of capacity; the date stamp associated with the battery capacity determined; and the battery capacity determined.

In further embodiments, determining the capacity of a battery in response to one or more discharge events measured by the battery gauge comprises determining a passed charge value for the battery for each discharge event.

In other embodiments, the storage is the device storage and still in other embodiments, the storage is the battery storage.

In additional embodiments, the date stamp is selected from the list comprising: a time stamp, a date stamp, a date and time stamp.

In another embodiment, the indication of the type of capacity is selected from the group consisting of: a full capacity and a minimum capacity.

And in yet other embodiments, the device is further operable to: compare the information related to the capacity of the battery based on the one or more discharge events; determine, based on the comparison, if there is degradation in battery capacity; and if there is degradation in battery capacity, display, on the display, a recommendation for the replacement of the battery.

In other embodiments, the display is a device display, and still in other embodiments, the display is a battery display.

A further aspect of the present invention discloses a device, comprising: a battery; a battery gauge; a display; storage; an input/output subsystem; one or more processors; and memory containing instructions executable by the one or more processors whereby the device is operable to: determine if the battery is charging; if the battery is charging, determine the voltage of the battery; if the voltage of the battery is greater than a first threshold, determine the current of the battery; and if the current of the battery is less than a second threshold, reset the passed charge value for the battery.

In some embodiments, the first threshold is a voltage threshold representing the voltage of the battery at full charge.

In other embodiments, the second threshold is a current threshold representing the current of the battery at full charge.

An additional aspect of the present invention discloses a device, comprising: a battery; a battery gauge; a display; storage; an input/output subsystem; one or more processors; and memory containing instructions executable by the one or more processors whereby the device is operable to: determine if the battery is discharging; if the battery is discharging, determine the voltage of the battery; if the voltage of the battery is less than a first threshold, determine information related to the capacity of the battery.

In further embodiments, the information related to the capacity of the battery comprises: the date stamp associated with the battery capacity determined; and the battery capacity determined.

And yet in other embodiments, the battery capacity determined is a passed charge value for the battery.

In still further embodiments, the device is further operable to: store, in the memory, the information related to the capacity of the battery.

In additional embodiments, the first threshold is a voltage threshold representing the minimum voltage required to record the capacity of the battery.

In other embodiments, the device is further operable to: if the voltage of the battery is less than a second threshold, record, in the storage, a full capacity event based on the information related to the capacity of the battery; if the voltage of the battery is greater than or equal to the second threshold, determine if a charge has been applied to the battery; and if a charge has been applied to the battery, record, in the storage, a minimum capacity event based on the information related to the capacity of the battery.

In more embodiments, the second threshold is a voltage threshold associated with a low voltage shut down of the device.

The foregoing illustrative summary, as well as other exemplary objectives and/or advantages of the invention, and the manner in which the same are accomplished, are further explained within the following detailed description and its accompanying drawings.

BRIEF DESCRIPTION OF THE DRAWINGS

FIG. 3 is a sample of the data recorded by the processes in FIGS. 2A and 2B regarding the actual capacity of the battery.

DETAILED DESCRIPTION

The present invention embraces the concept of using a battery gas gauge to track discharge and charge events over the lifetime of a battery to generate information on the useful capacity and state of health of the battery. Such tracking data can be used then to provide recommendations on the timing for replacing the battery. The information can also be used to identify workflow situations where the battery utilization is more efficient.

Figure 1:
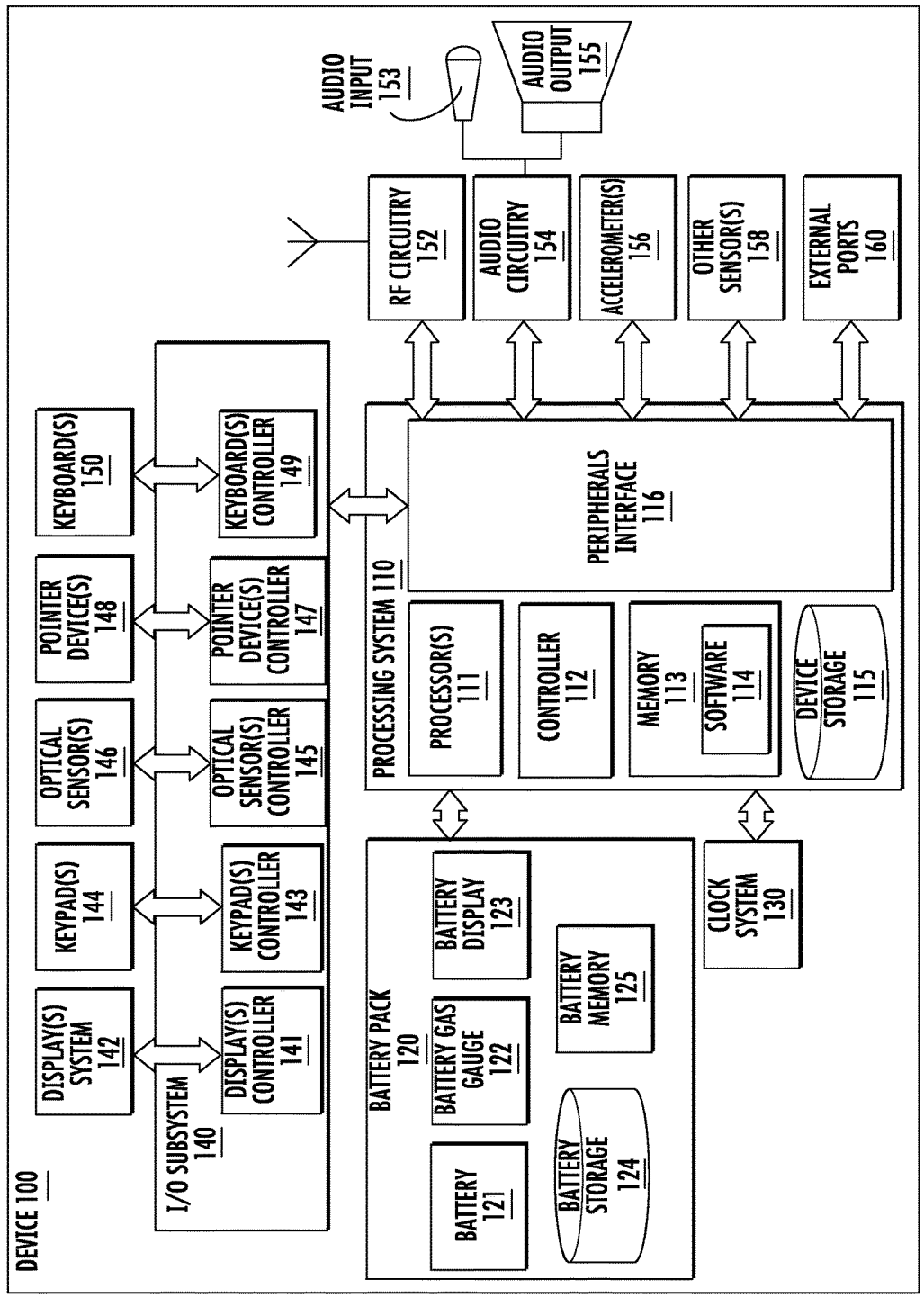
FIG. 1 is a block diagram of the hardware elements of a device according to embodiments of the disclosed subject matter.

FIG. 1 illustrates an exemplary device 100 for one embodiment of the present invention. The device 100 may include other components not shown in FIG. 1, nor further discussed herein for the sake of brevity. One having ordinary skill in the art will understand the additional hardware and software included but not shown in FIG. 1.

In general, device 100 may be implemented in any form of digital computer or mobile device. Digital computers may include, but are not limited to, laptops, desktops, workstations, fixed vehicle computers, vehicle mount computers, hazardous environment computers, rugged mobile computers, servers, blade servers, mainframes, other appropriate computers. Mobile devices may include, but are not limited to, cellular telephones, smart phones, personal digital assistants, tablets, pagers, two-way radios, netbooks, barcode scanners, radio frequency identification (RFID) readers, intelligent sensors, tracking devices, volume dimensioning devices, mobile dimensioners, and other similar computing devices.

In general, as shown, the device 100 of FIG. 1 includes a processing system 110 that includes one or more processors 111, such as Central Processing Units (CPUs), Application Specific Integrated Circuits (ASICs), and/or Field Programmable Gate Arrays (FPGAs), a memory controller 112, memory 113, which may include software 114, and other components that are not shown for brevity, such as busses, etc. The processing system may also include storage 115, such as a hard drive or solid state drive.

The processing system 110 also includes a peripherals interface 116 for communicating with an input/output (I/O) subsystem 140, which includes a display(s) controller 141 operative to control display(s) 142. In some embodiments the display(s) 142 is a touch-sensitive display system, and the display(s) controller 141 is further operative to process touch inputs on the touch sensitive display 142. The I/O subsystem 140 may also include a keypad(s) controller 143 operative to control keypad(s) 144 on the device 100. The I/O subsystem 140 also includes an optical sensor(s) controller 145 operative to control one or more optical sensor(s) 146. The optical sensor(s) may include, but is not limited to, a barcode sensor, a camera, and an image sensor. In some embodiments, the I/O subsystem 140 also includes a pointer device(s) controller 147 operative to control one or more pointer device(s) 148, such as a mouse or navigation shuttle. In yet other embodiments, the I/O subsystem 140 also includes a keyboard(s) controller 149 operative to control one or more keyboard(s) 150.

The peripherals interface 116 may also communicate with other components of the device 100, including but not limited to, radio frequency (RF) circuity 152, such as Wi-Fi and/or cellular communications circuitry such as wireless Ethernet, Bluetooth, and near field communication (NFC), audio circuitry 154 for the audio input component 153, such as a microphone, and audio output component 155, such as a speaker, one or more accelerometers 156, one or more other sensors 158, such as a location determination component such as a Global Positioning System (GPS) chip, and one or more external ports 160, which may be used for smart card readers or for wired connections such as wired Ethernet, USB, serial or $I^2C$ ports. The RF circuitry 152 and external ports 160 individually and collectively make up the communication interfaces for the device 100. The processing system 110 is also connected to a power system component that is used to power the device 100. In some embodiments, the power system component is a battery pack 120 that includes a battery 121 to provide power to the overall device 100, a battery gas gauge 122 to count Coulombs and determine the passed charge value for the battery, a battery display 123 to display status of the battery, battery storage 124 and battery memory 125. In some embodiments, the battery storage 124 is non-volatile storage, and the battery memory 125 is volatile storage. In some embodiments, there is no battery display 123 and the status of the battery is displayed on the display 142 of the device 100. The processing system 110 is also connected to a clock system component 130 that controls a timer for use by the disclosed embodiments.

The components of device 100 may be interconnected using one or more buses, represented generically by the arrows of FIG. 1, and may be mounted on a motherboard (not shown) or some other appropriate configuration.

Figure 2A:
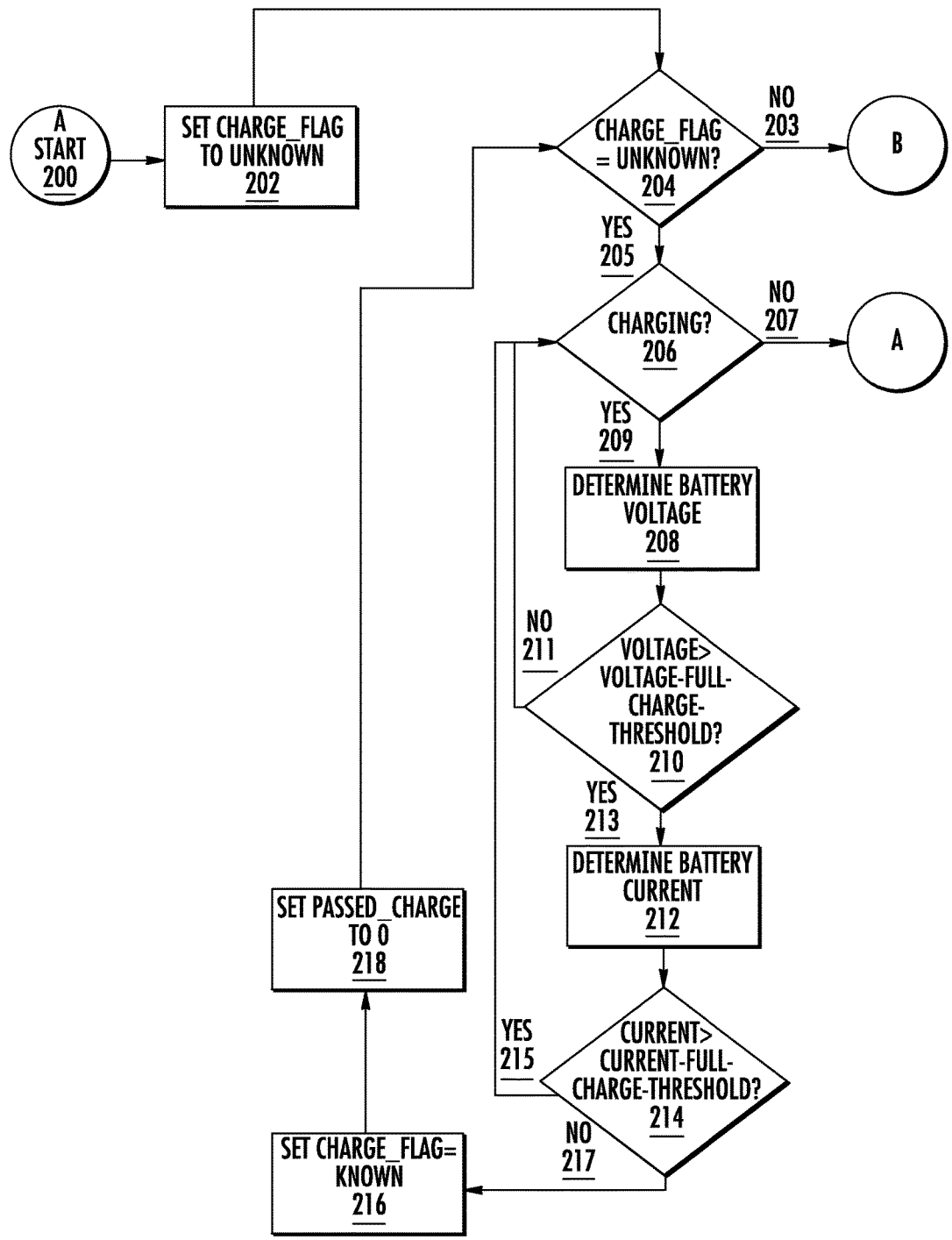
FIG. 2A is a flow chart outlining the process for determining the charge state of a battery pack.

FIG. 2A is a flow chart outlining the process for determining the charge state of a battery 121 in device 100. The process starts (Step 200) and the charge state of the battery 121 is initially unknown, and so a variable that is used to track the charge state of the battery 121, referred to as the charge_flag in FIG. 2A, is initially set to UNKNOWN (Step 202).

The value of the charge_flag variable is then checked (Step 204). If the charge_flag variable is known (Step 203), then the process continues as indicated by connector B. If the charge_flag variable is unknown (Step 205), then the process determines if the battery 121 is currently charging (Step 206).

If the battery 121 is not charging (Step 207), then the process continues as indicated by connector A. If the battery 121 is charging (Step 209), then the voltage of the battery 121 is determined (Step 208). A determination about the voltage of the battery 121 relative to a threshold voltage is made (Step 210).

If the voltage of the battery 121 is less than or equal to the threshold for the voltage of the battery at full charge, referred to as the "voltage-full-charge-threshold" in FIG. 2A (Step 211), then the process goes back to Step 206 and repeats until the battery 121 is at a full charge voltage. If the voltage of the battery 121 is greater than the voltage-full-charge-threshold (Step 213), then the process continues by determining the current for the battery 121 (Step 212). A determination about the current of the battery relative to threshold current is made (Step 214).

If the current for the battery 121 is greater than a threshold for the current of the battery at full charge, referred to as the "current-full-charge-threshold" (Step 215), then the process returns to Step 206 and repeats. In this case, the battery 121 is still drawing a significant current and is likely not fully charged. If the current of the battery 121 is less than or equal to the current-full-charge-threshold (Step 217), then the battery 121 is now at full charge state. The charge_flag is now set to KNOWN (Step 216) and a variable used to count Coulombs, referred to as the passed_charge value in FIG. 2A, is set to zero, and the process continues to Step 204 where, again, a determination is made regarding the charge_flag. In this case, now that the charge_flag is set to KNOWN, the determination fails (Step 203) and the process continues as indicated by the connector B.

Figure 2B:
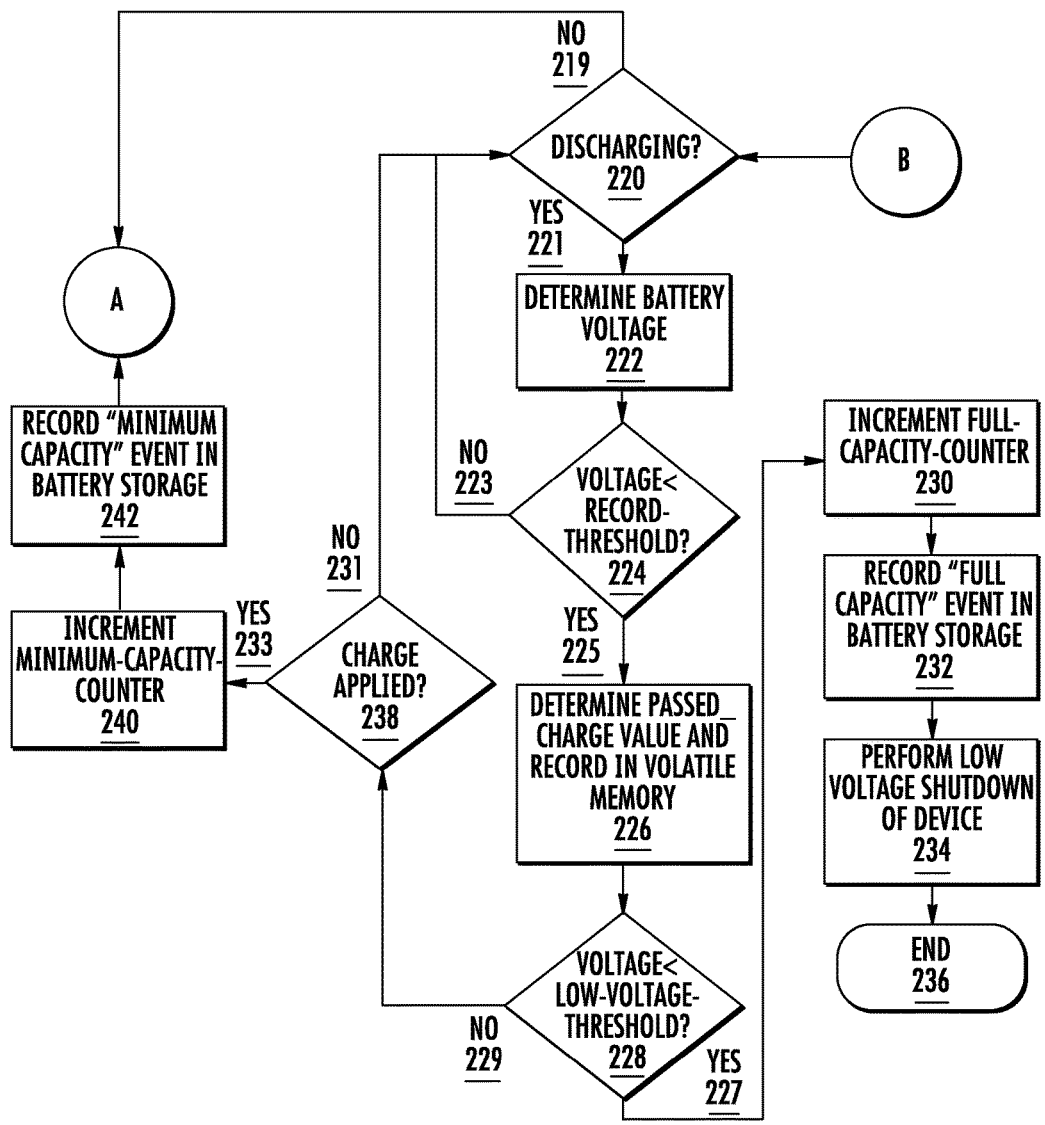
FIG. 2B is a flow chart outlining the process for tracking discharge and charge events to report the actual capacity of a battery.

Connector B from FIG. 2A continues then in FIG. 2B. FIG. 2B is a flow chart outlining the process for tracking discharge and charge events to report the actual capacity of a battery. The process continues by first determining if the battery 121 is discharging (Step 220). If the battery 121 is not discharging (Step 219), then the process continues as indicated by connector A. If the battery 121 is discharging (Step 221), then the voltage of the battery 121 is determined (Step 222). Next, a determination about the voltage of the battery 121 relative to a threshold voltage is made (Step 224).

If the voltage of the battery 121 is greater than or equal to the threshold for recording the voltage of the battery during discharge, referred to as the "voltage-record-threshold" in FIG. 2B (Step 223), then the process goes back to Step 220 and repeats until the battery 121 falls below a threshold required to record the discharge state. If the voltage of the battery 121 is less than the voltage-record-threshold (Step 225), then the process continues by determining the passed_charge value for the battery 121 at that time, i.e. using the battery gas gauge 122 to count Coulombs, and recording the passed_charge value and timestamp in volatile memory 125 (Step 226). In other embodiments, the passed_charge value and timestamp are recorded in the volatile memory 113 of the device 100. Note that the timestamp associated with the passed_charge value reading is created with the help of the clock system 130 of device 100 and may include a date, a time, or any combination therein. Further, in some embodiments, the timestamp recorded may have varying degrees of precision, depending upon the clock system 130 employed. In some embodiments, the timestamp may just record the day and the hour of the event, while in other embodiments, the precision may be down seconds or milliseconds.

The process then continues by making a determination about the voltage of the battery 121 relative to another threshold voltage (Step 228).

If the voltage of the battery 121 is less than the low voltage shutdown threshold for the battery 121, referred to as the "low-voltage-threshold" in FIG. 2B (Step 227), then the device 100 is about to be shut down in response to low voltage in the battery 121, and the capacity of the battery 121 should be recorded in accordance with embodiments of the present invention. Note that if the battery 121 has gone from a full charge state, as indicated in FIG. 2A, through a full discharge without any additional charging, then when the low-voltage-threshold is met, the data point that has been collected is a measure of the full capacity of the battery 121.

The process continues by first incrementing a counter designed to track the number of times a full discharge of the battery 121 occurs, referred to as the "full-capacity-counter" in FIG. 2B (Step 230). The full-capacity-counter is initially set to 0 during an initialization process with the battery pack 120. In some embodiments, the full-capacity-counter is stored in non-volatile memory 124 of the battery pack 120. In other embodiments, the full-capacity-counter is provisioned in non-volatile memory 115 of the device 100.

The process continues by recording the full capacity event in the battery storage 124, or in the device storage 115 in alternative embodiments (Step 232). The form and content of the event that is recorded is described in FIG. 3 below. The low voltage shutdown of the device is then performed (Step 234), and the process ends (Step 236).

Returning to Step 228, if the voltage of the battery 121 is greater than or equal to the low voltage shutdown threshold for the battery 121 (Step 229), then a determination is first made as to whether or not a charge has been applied to the batter 121 (Step 238). If no charge has been applied (Step 231), then the process returns to step 220 to continue to monitor discharge events. If a charge has been applied (Step 233), then there has been a partial discharge of the battery 121, and the capacity of the battery 121 should be recorded in accordance with embodiments of the present invention. Note that if the battery 121 has gone from a full charge state, as indicated in FIG. 2A, through a partial discharge before any additional charging, then the data point that has been collected is a measure of the minimum capacity of the battery 121.

The process continues by first incrementing a counter designed to track the number of times a minimum capacity of the battery 121 has been determined, referred to as the "minimum-capacity-counter" in FIG. 2B (Step 240). The minim-capacity-counter is initially set to 0 during an initialization process with the battery pack 120. In some embodiments, the minimum-capacity-counter is stored in non-volatile memory 124 of the battery pack 120. In other embodiments, the minimum-capacity-counter is provisioned in non-volatile memory 115 of the device 100.

The process continues by recording the minimum capacity event in the battery storage 124, or in the device storage 115 in alternative embodiments (Step 242). The form and content of the event that is recorded is described in FIG. 3 below. The process then continues as indicated by connector A.

FIG. 3 is a sample of the data recorded by the processes in FIGS. 2A and 2B regarding the actual capacity of the battery 121. In some embodiments, the information of FIG. 3 may be stored in a file in non-volatile storage, such as the battery storage 124. In other embodiments, the information may be stored in a file in the device storage 115. In yet other embodiments, the information may be stored in a database, either in battery storage 124 or device storage 115, or some combination therein.

The data illustrated in FIG. 3 has four components: the "count" field 302, the "last date updated" field 304, the "capacity" field 306, and the "type" field 308. The type field 308 indicates the type of capacity data recorded. There are only two types: a full capacity and a minimum capacity. The capacity field 306 is used to show the actual capacity of the battery 121 for the specific capacity type 308. In some embodiments, the battery capacity is reported as milliamp hours (mAh). The last date updated field 304 indicates the date and the time of the last capacity type reading 308. In some embodiments, the last date updated field 304 reports only the date, only the time, or some combination therein. The count field indicates the number of times that the capacity type 308 has been recorded. Taken together, the data of FIG. 3 provides information about the battery 121.

By way of a non-limiting example, FIG. 3 shows that the battery gas gauge 122 reported the third full capacity reading for the battery on Jan. 23, 2014 at 5:16:36 am, and that the full capacity was 3800 milliamp hours (mAh). Also by way of a non-limiting example, FIG. 3 shows that the battery gas gauge reported the fortieth minimum capacity reading for the battery on Mar. 5, 2014 at 5:48:15 pm, and that the minimum capacity was 2100 mAh.

The capacity data of FIG. 3 can then be used to determine further information about the battery pack 120. For example, in some embodiments, if the battery pack 120 never reports a full capacity reading, then it can be assumed that the customer is getting through the day on a full battery 121 and that the state of health of the battery 121 is very good. This information can then be displayed on either the battery display 123, the device display 142, or some combination therein. Similarly, in other embodiments, if every day, a full capacity reading is recorded, then it means that the battery pack 120 is not getting through the day, and it might be time to alert the customer to replace the battery pack 120. Again, such a recommendation or alert could be displayed on either the battery display 123, the device display 142, or some combination therein. In still further embodiments, the capacity data of FIG. 3 could provide insights into workflow usage. For example, a comparison of the capacity data across devices 100 that both started with new batteries might reveal different usage patterns that have significant impact on battery capacity throughout the day. The user could then employ this data to set policies for improved workflow.

To supplement the present disclosure, this application incorporates entirely by reference the following commonly assigned patents, patent application publications, and patent applications:

U.S. Pat. Nos. 6,832,725; 7,128,266; 7,159,783; 7,413,127; 7,726,575; 8,294,969; 8,317,105; 8,322,622; 8,366,005; 8,371,507; 8,376,233; 8,381,979; 8,390,909; 8,408,464; 8,408,468; 8,408,469; 8,424,768; 8,448,863; 8,457,013; 8,459,557; 8,469,272; 8,474,712; 8,479,992; 8,490,877; 8,517,271; 8,523,076; 8,528,818; 8,544,737; 8,548,242; 8,548,420; 8,550,335; 8,550,354; 8,550,357; 8,556,174; 8,556,176; 8,556,177; 8,559,767; 8,599,957; 8,561,895; 8,561,903; 8,561,905; 8,565,107; 8,571,307; 8,579,200; 8,583,924; 8,584,945; 8,587,595; 8,587,697; 8,588,869; 8,590,789; 8,596,539; 8,596,542; 8,596,543; 8,599,271; 8,599,957; 8,600,158; 8,600,167; 8,602,309; 8,608,053; 8,608,071; 8,611,309; 8,615,487; 8,616,454; 8,621,123; 8,622,303; 8,628,013; 8,628,015; 8,628,016; 8,629,926; 8,630,491; 8,635,309; 8,636,200; 8,636,212; 8,636,215; 8,636,224; 8,638,806; 8,640,958; 8,640,960; 8,643,717; 8,646,692; 8,646,694; 8,657,200; 8,659,397; 8,668,149; 8,678,285; 8,678,286; 8,682,077; 8,687,282; 8,692,927; 8,695,880; 8,698,949; 8,717,494; 8,717,494; 8,720,783; 8,723,804; 8,723,904; 8,727,223; D702,237; 8,740,082; 8,740,085; 8,746,563; 8,750,445; 8,752,766; 8,756,059; 8,757,495; 8,760,563; 8,763,909; 8,777,108; 8,777,109; 8,779,898; 8,781,520; 8,783,573; 8,789,757; 8,789,758; 8,789,759; 8,794,520; 8,794,522; 8,794,526; 8,798,367; 8,807,431; 8,807,432; 8,820,630;

International Publication No. 2013/163789;
International Publication No. 2013/173985;
International Publication No. 2014/019130;
International Publication No. 2014/110495;
U.S. Patent Application Publication No. 2008/0185432;
U.S. Patent Application Publication No. 2009/0134221;
U.S. Patent Application Publication No. 2010/0177080;
U.S. Patent Application Publication No. 2010/0177076;
U.S. Patent Application Publication No. 2010/0177707;
U.S. Patent Application Publication No. 2010/0177749;
U.S. Patent Application Publication No. 2011/0202554;
U.S. Patent Application Publication No. 2012/0111946;
U.S. Patent Application Publication No. 2012/0138685;
U.S. Patent Application Publication No. 2012/0168511;
U.S. Patent Application Publication No. 2012/0168512;
U.S. Patent Application Publication No. 2012/0193423;
U.S. Patent Application Publication No. 2012/0203647;
U.S. Patent Application Publication No. 2012/0223141;
U.S. Patent Application Publication No. 2012/0228382;
U.S. Patent Application Publication No. 2012/0248188;
U.S. Patent Application Publication No. 2013/0043312;
U.S. Patent Application Publication No. 2013/0056285;
U.S. Patent Application Publication No. 2013/0070322;
U.S. Patent Application Publication No. 2013/0075168;
U.S. Patent Application Publication No. 2013/0082104;
U.S. Patent Application Publication No. 2013/0175341;
U.S. Patent Application Publication No. 2013/0175343;
U.S. Patent Application Publication No. 2013/0200158;
U.S. Patent Application Publication No. 2013/0256418;
U.S. Patent Application Publication No. 2013/0257744;
U.S. Patent Application Publication No. 2013/0257759;
U.S. Patent Application Publication No. 2013/0270346;
U.S. Patent Application Publication No. 2013/0278425;
U.S. Patent Application Publication No. 2013/0287258;
U.S. Patent Application Publication No. 2013/0292475;
U.S. Patent Application Publication No. 2013/0292477;
U.S. Patent Application Publication No. 2013/0293539;
U.S. Patent Application Publication No. 2013/0293540;
U.S. Patent Application Publication No. 2013/0306728;
U.S. Patent Application Publication No. 2013/0306730;
U.S. Patent Application Publication No. 2013/0306731;
U.S. Patent Application Publication No. 2013/0307964;
U.S. Patent Application Publication No. 2013/0308625;
U.S. Patent Application Publication No. 2013/0313324;
U.S. Patent Application Publication No. 2013/0313325;
U.S. Patent Application Publication No. 2013/0341399;
U.S. Patent Application Publication No. 2013/0342717;
U.S. Patent Application Publication No. 2014/0001267;
U.S. Patent Application Publication No. 2014/0002828;
U.S. Patent Application Publication No. 2014/0008430;
U.S. Patent Application Publication No. 2014/0008439;
U.S. Patent Application Publication No. 2014/0025584;
U.S. Patent Application Publication No. 2014/0027518;
U.S. Patent Application Publication No. 2014/0034734;
U.S. Patent Application Publication No. 2014/0036848;
U.S. Patent Application Publication No. 2014/0039693;
U.S. Patent Application Publication No. 2014/0042814;
U.S. Patent Application Publication No. 2014/0049120;
U.S. Patent Application Publication No. 2014/0049635;
U.S. Patent Application Publication No. 2014/0061305;
U.S. Patent Application Publication No. 2014/0061306;
U.S. Patent Application Publication No. 2014/0063289;
U.S. Patent Application Publication No. 2014/0066136;
U.S. Patent Application Publication No. 2014/0067692;
U.S. Patent Application Publication No. 2014/0070005;
U.S. Patent Application Publication No. 2014/0071840;
U.S. Patent Application Publication No. 2014/0074746;
U.S. Patent Application Publication No. 2014/0075846;
U.S. Patent Application Publication No. 2014/0076974;
U.S. Patent Application Publication No. 2014/0078341;
U.S. Patent Application Publication No. 2014/0078342;
U.S. Patent Application Publication No. 2014/0078345;
U.S. Patent Application Publication No. 2014/0084068;
U.S. Patent Application Publication No. 2014/0097249;
U.S. Patent Application Publication No. 2014/0098792;
U.S. Patent Application Publication No. 2014/0100774;
U.S. Patent Application Publication No. 2014/0100813;
U.S. Patent Application Publication No. 2014/0103115;
U.S. Patent Application Publication No. 2014/0104413;
U.S. Patent Application Publication No. 2014/0104414;
U.S. Patent Application Publication No. 2014/0104416;
U.S. Patent Application Publication No. 2014/0104451;

U.S. Patent Application Publication No. 2014/0106594;
U.S. Patent Application Publication No. 2014/0106725;
U.S. Patent Application Publication No. 2014/0108010;
U.S. Patent Application Publication No. 2014/0108402;
U.S. Patent Application Publication No. 2014/0108682;
U.S. Patent Application Publication No. 2014/0110485;
U.S. Patent Application Publication No. 2014/0114530;
U.S. Patent Application Publication No. 2014/0124577;
U.S. Patent Application Publication No. 2014/0124579;
U.S. Patent Application Publication No. 2014/0125842;
U.S. Patent Application Publication No. 2014/0125853;
U.S. Patent Application Publication No. 2014/0125999;
U.S. Patent Application Publication No. 2014/0129378;
U.S. Patent Application Publication No. 2014/0131438;
U.S. Patent Application Publication No. 2014/0131441;
U.S. Patent Application Publication No. 2014/0131443;
U.S. Patent Application Publication No. 2014/0131444;
U.S. Patent Application Publication No. 2014/0131445;
U.S. Patent Application Publication No. 2014/0131448;
U.S. Patent Application Publication No. 2014/0133379;
U.S. Patent Application Publication No. 2014/0136208;
U.S. Patent Application Publication No. 2014/0140585;
U.S. Patent Application Publication No. 2014/0151453;
U.S. Patent Application Publication No. 2014/0152882;
U.S. Patent Application Publication No. 2014/0158770;
U.S. Patent Application Publication No. 2014/0159869;
U.S. Patent Application Publication No. 2014/0160329;
U.S. Patent Application Publication No. 2014/0166755;
U.S. Patent Application Publication No. 2014/0166757;
U.S. Patent Application Publication No. 2014/0166759;
U.S. Patent Application Publication No. 2014/0166760;
U.S. Patent Application Publication No. 2014/0166761;
U.S. Patent Application Publication No. 2014/0168787;
U.S. Patent Application Publication No. 2014/0175165;
U.S. Patent Application Publication No. 2014/0175169;
U.S. Patent Application Publication No. 2014/0175172;
U.S. Patent Application Publication No. 2014/0175174;
U.S. Patent Application Publication No. 2014/0191644;
U.S. Patent Application Publication No. 2014/0191913;
U.S. Patent Application Publication No. 2014/0197238;
U.S. Patent Application Publication No. 2014/0197239;
U.S. Patent Application Publication No. 2014/0197304;
U.S. Patent Application Publication No. 2014/0203087;
U.S. Patent Application Publication No. 2014/0204268;
U.S. Patent Application Publication No. 2014/0214631;
U.S. Patent Application Publication No. 2014/0217166;
U.S. Patent Application Publication No. 2014/0217180;
U.S. patent application Ser. No. 13/367,978 for a Laser Scanning Module Employing an Elastomeric U-Hinge Based Laser Scanning Assembly, filed Feb. 7, 2012 (Feng et al.);
U.S. patent application Ser. No. 29/436,337 for an Electronic Device, filed Nov. 5, 2012 (Fitch et al.);
U.S. patent application Ser. No. 13/771,508 for an Optical Redirection Adapter, filed Feb. 20, 2013 (Anderson);
U.S. patent application Ser. No. 13/852,097 for a System and Method for Capturing and Preserving Vehicle Event Data, filed Mar. 28, 2013 (Barker et al.);
U.S. patent application Ser. No. 13/902,110 for a System and Method for Display of Information Using a Vehicle-Mount Computer, filed May 24, 2013 (Hollifield);
U.S. patent application Ser. No. 13/902,144, for a System and Method for Display of Information Using a Vehicle-Mount Computer, filed May 24, 2013 (Chamberlin);
U.S. patent application Ser. No. 13/902,242 for a System For Providing A Continuous Communication Link With A Symbol Reading Device, filed May 24, 2013 (Smith et al.);
U.S. patent application Ser. No. 13/912,262 for a Method of Error Correction for 3D Imaging Device, filed Jun. 7, 2013 (Jovanovski et al.);
U.S. patent application Ser. No. 13/912,702 for a System and Method for Reading Code Symbols at Long Range Using Source Power Control, filed Jun. 7, 2013 (Xian et al.);
U.S. patent application Ser. No. 29/458,405 for an Electronic Device, filed Jun. 19, 2013 (Fitch et al.);
U.S. patent application Ser. No. 13/922,339 for a System and Method for Reading Code Symbols Using a Variable Field of View, filed Jun. 20, 2013 (Xian et al.);
U.S. patent application Ser. No. 13/927,398 for a Code Symbol Reading System Having Adaptive Autofocus, filed Jun. 26, 2013 (Todeschini);
U.S. patent application Ser. No. 13/930,913 for a Mobile Device Having an Improved User Interface for Reading Code Symbols, filed Jun. 28, 2013 (Gelay et al.);
U.S. patent application Ser. No. 29/459,620 for an Electronic Device Enclosure, filed Jul. 2, 2013 (London et al.);
U.S. patent application Ser. No. 29/459,681 for an Electronic Device Enclosure, filed Jul. 2, 2013 (Chaney et al.);
U.S. patent application Ser. No. 13/933,415 for an Electronic Device Case, filed Jul. 2, 2013 (London et al.);
U.S. patent application Ser. No. 29/459,785 for a Scanner and Charging Base, filed Jul. 3, 2013 (Fitch et al.);
U.S. patent application Ser. No. 29/459,823 for a Scanner, filed Jul. 3, 2013 (Zhou et al.);
U.S. patent application Ser. No. 13/947,296 for a System and Method for Selectively Reading Code Symbols, filed Jul. 22, 2013 (Rueblinger et al.);
U.S. patent application Ser. No. 13/950,544 for a Code Symbol Reading System Having Adjustable Object Detection, filed Jul. 25, 2013 (Jiang);
U.S. patent application Ser. No. 13/961,408 for a Method for Manufacturing Laser Scanners, filed Aug. 7, 2013 (Saber et al.);
U.S. patent application Ser. No. 14/018,729 for a Method for Operating a Laser Scanner, filed Sep. 5, 2013 (Feng et al.);
U.S. patent application Ser. No. 14/019,616 for a Device Having Light Source to Reduce Surface Pathogens, filed Sep. 6, 2013 (Todeschini);
U.S. patent application Ser. No. 14/023,762 for a Handheld Indicia Reader Having Locking Endcap, filed Sep. 11, 2013 (Gannon);
U.S. patent application Ser. No. 14/035,474 for Augmented-Reality Signature Capture, filed Sep. 24, 2013 (Todeschini);
U.S. patent application Ser. No. 29/468,118 for an Electronic Device Case, filed Sep. 26, 2013 (Oberpriller et al.);
U.S. patent application Ser. No. 14/055,234 for Dimensioning System, filed Oct. 16, 2013 (Fletcher);
U.S. patent application Ser. No. 14/053,314 for Indicia Reader, filed Oct. 14, 2013 (Huck);
U.S. patent application Ser. No. 14/065,768 for Hybrid System and Method for Reading Indicia, filed Oct. 29, 2013 (Meier et al.);
U.S. patent application Ser. No. 14/074,746 for Self-Checkout Shopping System, filed Nov. 8, 2013 (Hejl et al.);
U.S. patent application Ser. No. 14/074,787 for Method and System for Configuring Mobile Devices via NFC Technology, filed Nov. 8, 2013 (Smith et al.);

U.S. patent application Ser. No. 14/087,190 for Optimal Range Indicators for Bar Code Validation, filed Nov. 22, 2013 (Hejl);

U.S. patent application Ser. No. 14/094,087 for Method and System for Communicating Information in an Digital Signal, filed Dec. 2, 2013 (Peake et al.);

U.S. patent application Ser. No. 14/101,965 for High Dynamic-Range Indicia Reading System, filed Dec. 10, 2013 (Xian);

U.S. patent application Ser. No. 14/150,393 for Indicia-reader Having Unitary Construction Scanner, filed Jan. 8, 2014 (Colavito et al.);

U.S. patent application Ser. No. 14/154,207 for Laser Barcode Scanner, filed Jan. 14, 2014 (Hou et al.);

U.S. patent application Ser. No. 14/165,980 for System and Method for Measuring Irregular Objects with a Single Camera filed Jan. 28, 2014 (Li et al.);

U.S. patent application Ser. No. 14/166,103 for Indicia Reading Terminal Including Optical Filter filed Jan. 28, 2014 (Lu et al.);

U.S. patent application Ser. No. 14/200,405 for Indicia Reader for Size-Limited Applications filed Mar. 7, 2014 (Feng et al.);

U.S. patent application Ser. No. 14/231,898 for Hand-Mounted Indicia-Reading Device with Finger Motion Triggering filed Apr. 1, 2014 (Van Horn et al.);

U.S. patent application Ser. No. 14/250,923 for Reading Apparatus Having Partial Frame Operating Mode filed Apr. 11, 2014, (Deng et al.);

U.S. patent application Ser. No. 14/257,174 for Imaging Terminal Having Data Compression filed Apr. 21, 2014, (Barber et al.);

U.S. patent application Ser. No. 14/257,364 for Docking System and Method Using Near Field Communication filed Apr. 21, 2014 (Showering);

U.S. patent application Ser. No. 14/264,173 for Autofocus Lens System for Indicia Readers filed Apr. 29, 2014 (Ackley et al.);

U.S. patent application Ser. No. 14/274,858 for Mobile Printer with Optional Battery Accessory filed May 12, 2014 (Marty et al.);

U.S. patent application Ser. No. 14/277,337 for MULTIPURPOSE OPTICAL READER, filed May 14, 2014 (Jovanovski et al.);

U.S. patent application Ser. No. 14/283,282 for TERMINAL HAVING ILLUMINATION AND FOCUS CONTROL filed May 21, 2014 (Liu et al.);

U.S. patent application Ser. No. 14/300,276 for METHOD AND SYSTEM FOR CONSIDERING INFORMATION ABOUT AN EXPECTED RESPONSE WHEN PERFORMING SPEECH RECOGNITION, filed Jun. 10, 2014 (Braho et al.);

U.S. patent application Ser. No. 14/305,153 for INDICIA READING SYSTEM EMPLOYING DIGITAL GAIN CONTROL filed Jun. 16, 2014 (Xian et al.);

U.S. patent application Ser. No. 14/310,226 for AUTOFOCUSING OPTICAL IMAGING DEVICE filed Jun. 20, 2014 (Koziol et al.);

U.S. patent application Ser. No. 14/327,722 for CUSTOMER FACING IMAGING SYSTEMS AND METHODS FOR OBTAINING IMAGES filed Jul. 10, 2014 (Oberpriller et al,);

U.S. patent application Ser. No. 14/327,827 for a MOBILE-PHONE ADAPTER FOR ELECTRONIC TRANSACTIONS, filed Jul. 10, 2014 (Hejl);

U.S. patent application Ser. No. 14/329,303 for CELL PHONE READING MODE USING IMAGE TIMER filed Jul. 11, 2014 (Coyle);

U.S. patent application Ser. No. 14/333,588 for SYMBOL READING SYSTEM WITH INTEGRATED SCALE BASE filed Jul. 17, 2014 (Barten);

U.S. patent application Ser. No. 14/334,934 for a SYSTEM AND METHOD FOR INDICIA VERIFICATION, filed Jul. 18, 2014 (Hejl);

U.S. patent application Ser. No. 14/336,188 for METHOD OF AND SYSTEM FOR DETECTING OBJECT WEIGHING INTERFERENCES, Filed Jul. 21, 2014 (Amundsen et al.);

U.S. patent application Ser. No. 14/339,708 for LASER SCANNING CODE SYMBOL READING SYSTEM, filed Jul. 24, 2014 (Xian et al.);

U.S. patent application Ser. No. 14/340,627 for an AXIALLY REINFORCED FLEXIBLE SCAN ELEMENT, filed Jul. 25, 2014 (Rueblinger et al.);

U.S. patent application Ser. No. 14/340,716 for an OPTICAL IMAGER AND METHOD FOR CORRELATING A MEDICATION PACKAGE WITH A PATIENT, filed Jul. 25, 2014 (Ellis);

U.S. patent application Ser. No. 14/342,544 for Imaging Based Barcode Scanner Engine with Multiple Elements Supported on a Common Printed Circuit Board filed Mar. 4, 2014 (Liu et al.);

U.S. patent application Ser. No. 14/345,735 for Optical Indicia Reading Terminal with Combined Illumination filed Mar. 19, 2014 (Ouyang);

U.S. patent application Ser. No. 14/336,188 for METHOD OF AND SYSTEM FOR DETECTING OBJECT WEIGHING INTERFERENCES, Filed Jul. 21, 2014 (Amundsen et al.);

U.S. patent application Ser. No. 14/355,613 for Optical Indicia Reading Terminal with Color Image Sensor filed May 1, 2014 (Lu et al.);

U.S. patent application Ser. No. 14/370,237 for WEB-BASED SCAN-TASK ENABLED SYSTEM AND METHOD OF AND APPARATUS FOR DEVELOPING AND DEPLOYING THE SAME ON A CLIENT-SERVER NETWORK filed Jul. 2, 2014 (Chen et al.);

U.S. patent application Ser. No. 14/370,267 for INDUSTRIAL DESIGN FOR CONSUMER DEVICE BASED SCANNING AND MOBILITY, filed Jul. 2, 2014 (Ma et al.);

U.S. patent application Ser. No. 14/376,472, for an ENCODED INFORMATION READING TERMINAL INCLUDING HTTP SERVER, filed 08-04-2014 (Lu);

U.S. patent application Ser. No. 14/379,057 for METHOD OF USING CAMERA SENSOR INTERFACE TO TRANSFER MULTIPLE CHANNELS OF SCAN DATA USING AN IMAGE FORMAT filed Aug. 15, 2014 (Wang et al.);

U.S. patent application Ser. No. 14/452,697 for INTERACTIVE INDICIA READER, filed Aug. 6, 2014 (Todeschini);

U.S. patent application Ser. No. 14/453,019 for DIMENSIONING SYSTEM WITH GUIDED ALIGNMENT, filed Aug. 6, 2014 (Li et al.);

U.S. patent application Ser. No. 14/460,387 for APPARATUS FOR DISPLAYING BAR CODES FROM LIGHT EMITTING DISPLAY SURFACES filed Aug. 15, 2014 (Van Horn et al.);

U.S. patent application Ser. No. 14/460,829 for ENCODED INFORMATION READING TERMINAL WITH WIRELESS PATH SELECTION CAPABILITY, filed Aug. 15, 2014 (Wang et al.);

U.S. patent application Ser. No. 14/462,801 for MOBILE COMPUTING DEVICE WITH DATA COGNITION SOFTWARE, filed on Aug. 19, 2014 (Todeschini et al.);

U.S. patent application Ser. No. 14/446,387 for INDICIA READING TERMINAL PROCESSING PLURALITY OF FRAMES OF IMAGE DATA RESPONSIVELY TO TRIGGER SIGNAL ACTIVATION filed Jul. 30, 2014 (Wang et al.);

U.S. patent application Ser. No. 14/446,391 for MULTIFUNCTION POINT OF SALE APPARATUS WITH OPTICAL SIGNATURE CAPTURE filed Jul. 30, 2014 (Good et al.);

U.S. patent application Ser. No. 29/486,759 for an Imaging Terminal, filed Apr. 2, 2014 (Oberpriller et al.);

U.S. patent application Ser. No. 29/492,903 for an INDICIA SCANNER, filed Jun. 4, 2014 (Zhou et al.); and U.S. patent application Ser. No. 29/494,725 for an IN-COUNTER BARCODE SCANNER, filed Jun. 24, 2014 (Oberpriller et al.).

In the specification and/or figures, typical embodiments of the invention have been disclosed. The present invention is not limited to such exemplary embodiments. The use of the term "and/or" includes any and all combinations of one or more of the associated listed items. The figures are schematic representations and so are not necessarily drawn to scale. Unless otherwise noted, specific terms have been used in a generic and descriptive sense and not for purposes of limitation.

The invention claimed is:

1. A device, comprising:
    a battery;
    a battery gauge;
    a display;
    storage;
    an input/output subsystem;
    one or more processors; and
    memory containing instructions executable by the one or more processors whereby the device is operable to:
        determine if the battery is discharging;
        monitor, in response to determining that the battery is discharging, one or more parameters associated with the battery during discharge to detect discharge events;
        determine a minimum capacity and a maximum capacity of the battery in response to the detection of the discharge events measured by the battery gauge;
        determine a first count of minimum capacity of the battery and a second count of maximum capacity of battery based upon the discharge events;
        store, in the storage, information relating to the battery's state of health including the determined capacity and count information based upon the discharge events;
        determine a state of health of the battery based, at least in part, upon the stored information, the state of health being a measurement of an available discharge capacity in the battery compared to a discharge capacity needed for a workflow executed by a user of the device; and
        display, on the display, an indication of the determined state of health.

2. The device of claim 1, wherein the information related to the state of health of the battery comprises:
    an indication of a type of capacity;
    a counter associated with the type of capacity;
    a date stamp associated with the battery capacity determined; and
    the battery capacity determined.

3. The device of claim 1, wherein determining the minimum capacity and the maximum capacity of the battery in response to discharge events comprises determining a value of electrical charge passed from the battery for each discharge event.

4. The device of claim 1, wherein the storage is the device storage.

5. The device of claim 1, wherein the storage is the battery storage.

6. The device of claim 2, wherein the date stamp comprises a time and/or a date.

7. The device of claim 2, wherein the indication of the type of capacity is selected from the group consisting of: a maximum capacity and a minimum capacity.

8. The device of claim 1, wherein the device is further operable to:
    compare the information related to the state of health of the battery based on the one or more discharge events;
    determine, based on the comparison, if there is degradation in battery capacity; and
    if there is degradation in battery capacity, display, on the display, a recommendation for the replacement of the battery.

9. The device of claim 1, wherein the display is a device display.

10. The device of claim 1, wherein the display is a battery display.

11. A device, comprising:
    a battery;
    a battery gauge;
    a display;
    storage;
    an input/output subsystem;
    one or more processors; and
    memory containing instructions executable by the one or more processors whereby the device is operable to:
        determine if the battery is charging;
        in response to determining that the battery is charging, determine a voltage of the battery and compare the voltage to a first threshold;
        in response to determining that the voltage of the battery is greater than the first threshold based upon the comparison, determine a current of the battery and compare the current to a second threshold;
        in response to determining that the current of the battery is less than the second threshold based upon the comparison, reset a value for electrical charge passed from the battery during discharge;
        determine if the battery is discharging;
        monitor, in response to determining that the battery is discharging, one or more parameters associated with the battery during discharge to detect discharge events;
        determine a minimum capacity and a maximum capacity of the battery in response to the detection of the discharge events measured by the battery gauge;
        determine a first count of minimum capacity of the battery and a second count of maximum capacity of battery based upon the discharge events;

store, in the storage, information relating to the battery's state of health including the determined capacity and count information based upon the discharge events;

determine a state of health of the battery based, at least in part, upon the stored information, the state of health being a measurement of an available discharge capacity in the battery compared to a discharge capacity needed for a workflow executed by a user of the device; and display, on the display, an indication of the determined state of health.

12. The device of claim 11, wherein the first threshold is a voltage threshold representing the voltage of the battery at full charge.

13. The device of claim 11, wherein the second threshold is a current threshold representing the current of the battery at full charge.

14. A device, comprising:
a battery;
a battery gauge;
a display;
storage;
an input/output subsystem;
one or more processors; and
memory containing instructions executable by the one or more processors whereby the device is operable to:
determine if the battery is discharging;
in response to determining that the battery is discharging, determine a voltage of the battery and compare the voltage to a first threshold;
in response to determining that the voltage of the battery is less than the first threshold, determine a capacity of the battery, and a date stamp associated with the determined capacity of the battery;
determine if the voltage of the battery is less than a second threshold based upon a comparison to the second threshold and, in response to determining that the voltage of the battery is less than the second threshold, record, in the storage, a full capacity event based on the determined capacity of the battery;

determine if the voltage of the battery is greater than or equal to the second threshold based upon the comparison to the second threshold, and determine if a charge has been applied to the battery;

in response to determining that the charge has been applied to the battery, record, in the storage, a minimum capacity event based on the determined capacity of the battery;

determine a first count of minimum capacity of the battery and a second count of full capacity of battery based upon the events;

store, in the storage, information relating to the battery's state of health including the determined capacity and count information based upon the events;

determine a state of health of the battery based, at least in part, upon the stored information, the state of health being a measurement of an available discharge capacity in the battery compared to a discharge capacity needed for a workflow executed by a user of the device; and display, on the display, an indication of the determined state of health.

15. The device of claim 14, wherein the battery capacity determined is a value of electrical charge passed from the battery.

16. The device of claim 14, where in the device is further operable to:
store, in the memory, the determined capacity of the battery.

17. The device of claim 14, wherein the first threshold is a voltage threshold representing a minimum voltage required to record the capacity of the battery.

18. The device of claim 14, wherein the second threshold is a voltage threshold associated with a low voltage shut down of the device.

* * * * *